United States Patent [19]

Myers et al.

[11] Patent Number: 5,470,790
[45] Date of Patent: Nov. 28, 1995

[54] VIA HOLE PROFILE AND METHOD OF FABRICATION

[75] Inventors: Alan M. Myers, Hillsboro; Peter K. Charvat, Portland; Thomas A. Letson, Beaverton; Shi-ning Yang, Portland; Peng Bai, Aloha, all of Oreg.

[73] Assignee: Intel Corporation, Santa Clara, Calif.

[21] Appl. No.: 324,763

[22] Filed: Oct. 17, 1994

[51] Int. Cl.$^6$ ............................................. H01L 21/302
[52] U.S. Cl. ..................... 437/192; 437/194; 437/195; 437/246; 437/947; 437/981; 257/774
[58] Field of Search ........................... 437/192, 194, 437/195, 947, 981, 246; 257/773, 774, 775, 923; 148/DIG. 161

[56] References Cited

U.S. PATENT DOCUMENTS

| | | | |
|---|---|---|---|
| 4,507,852 | 4/1985 | Karulkar | 437/195 |
| 4,714,686 | 12/1987 | Sander et al. | 437/195 |
| 4,879,257 | 11/1989 | Patrick | 437/195 |
| 5,106,461 | 4/1992 | Volfson et al. | 437/195 |
| 5,312,775 | 5/1994 | Fujii et al. | 437/194 |
| 5,408,130 | 4/1995 | Woo et al. | 257/774 |

FOREIGN PATENT DOCUMENTS

| | | |
|---|---|---|
| 63-133647 | 6/1988 | Japan . |
| 02122546 | 5/1990 | Japan . |

OTHER PUBLICATIONS

Hasegawa, et al., Via Filling on Al Films by Selective CVD W Using Al Isotropic Etching, *Japan Society of Appl. Physics*, 52nd Fall Meeting Extended Abstracts, p. 718 (Oct. 1991).

Weide, K. et al., 3–Dimensional Simulations of Temperature and Current Density Distribution in a Via Structure, *IEEE/IRPS*, pp. 361–365, (Jan. 1992).

Totta, Paul A., Stress Induced Phenomena in Metallizations: U.S. Perspective, *American Institute of Physics*, pp. 1–20, (1992).

Gardner, D. et al., Layered and Homogeneous Films of Aluminum and Aluminum/Silicon with Titanitum, Zirconium, and Tungsten for Multilevel Interconnects, *IEDM 84*, pp. 114–117 (1984).

Gardner, D. et al., Interconnection and Electromigration Scaling Theory, *IEEE Transactions on Electron Devices*, vol. ED–34, No. 3, pp. 632–643, (Mar. 1987).

*Primary Examiner*—George Fourson
*Assistant Examiner*—Thomas G. Bilodeau
*Attorney, Agent, or Firm*—Blakely, Sokoloff, Taylor & Zafman

[57] ABSTRACT

A novel high performance and reliable interconnection structure for preventing via delamination. The interconnection structure of the present invention comprises a via connection which extends into and undercuts an underlying interconnection line to lock the via connection into the interconnection line.

15 Claims, 5 Drawing Sheets

VIA HOLE PROFILE AND METHOD OF FABRICATION

BACKGROUND OF THE INVENTION

1. Field of the Invention

The present invention relates to the field of semiconductor integrated circuit and more specifically to a novel interconnection structure for an integrated circuit and its method of fabrication.

2. Discussion of Related Art

Modern integrated circuits are made up of literally millions of active and passive devices such as transistors, capacitors, and resistors. These devices are initially isolated from one another but are later interconnected together to form functional circuits. The quality of the interconnection structure drastically affects the performance and reliability of the fabricated circuit. Interconnections are increasingly determining the limits of performance and density of modern ultra large scale integrated (ULSI) circuits.

FIG. 1 a is a cross-sectional illustration of an interconnection structure which is presently used in the semiconductor industry. Formed in a silicon substrate or well 102 are active devices (not shown) such as transistors and capacitors. Interconnection lines 104 and 106, which are typically aluminum or aluminum alloys, are used to couple active devices into functional circuits. Metal interconnections 104 and 106 and substrate 102 are electrically isolated from one another by interlevel dielectric's (ILDs) 108 and 110, respectively. Electrical connections are made between metal interconnections 104 and 106 through the use of metal, typically tungsten, vias or plugs 112.

A serious reliability problem associated with interconnection structure of FIG. 1a and its method of fabrication is via delamination. Via delamination is a physical separation 114 between a via and the underlying metal interconnect as shown in FIG. 1 b. Physical separation between a via connection and an underlying metal interconnection can cause open circuits to be formed resulting in complete failure of the device or circuit.

Although not entirely understood, via delamination is most likely the result of several factors including: high stresses in the ILD, interconnection, and via materials, contaminated metal interconnection/plug interfaces, and weak interconnection/ILD and interconnection/plug interfaces. During the lifetime of a semiconductor device, the device is subjected to substantial thermal cycling. For example, various temperature conditions are encountered throughout the entire manufacturing process and packaging of the device. Additionally, during device operation, large current densities flow through vias and interconnections causing temperature increases in high resistance areas such as the interface between vias and the underlying interconnection.

As a result of different thermal expansion coefficients of the metal interconnects, vias, and insulating layers, the via connections are subjected to large amounts of stress as the device is temperature cycled. Additionally, various residues consisting of fluorides and oxides, formed during the via etch process, are generally left at the interface prior to via metallization. These fluorides and oxides are generally brittle materials and when subjected to large amounts of thermal stress, crack and cause via delamination.

Thus, what is needed is a novel interconnection structure and method of fabrication which can resist via delamination.

SUMMARY OF THE INVENTION

A novel interconnection structure which prevents via delamination is described. A multilayer interconnection comprising a titanium aluminide electromigration shunt layer, an aluminum alloy bulk conductor, and a titanium aluminide capping layer is formed on an insulating layer of a semiconductor substrate. A second insulating layer is formed on and around the multilayer interconnection. A via connection comprising tungsten has a first portion with a first width which extends through the insulating layer and through the capping layer of the interconnection line, and a second portion wider than the first portion, which is formed on the bulk conductor and underneath the capping layer to thereby lock the via connection into the interconnection.

DETAILED DESCRIPTION OF THE PRESENT INVENTION

The present invention describes a novel high-density, high-reliability, high-performance interconnection structure with a USI manufacturable process. In the following description numerous specific details are set forth, such as specific materials, processes, and equipment in order to provide a thorough understanding of the present invention. It will be obvious however, to one skilled in the art, that the present invention may be practiced without these specific details. In other instance, well-known semiconductor manufacturing materials, processes, and equipment have not been set forth in detail in order to not unnecessarily obscure the present invention.

Figure 1A:
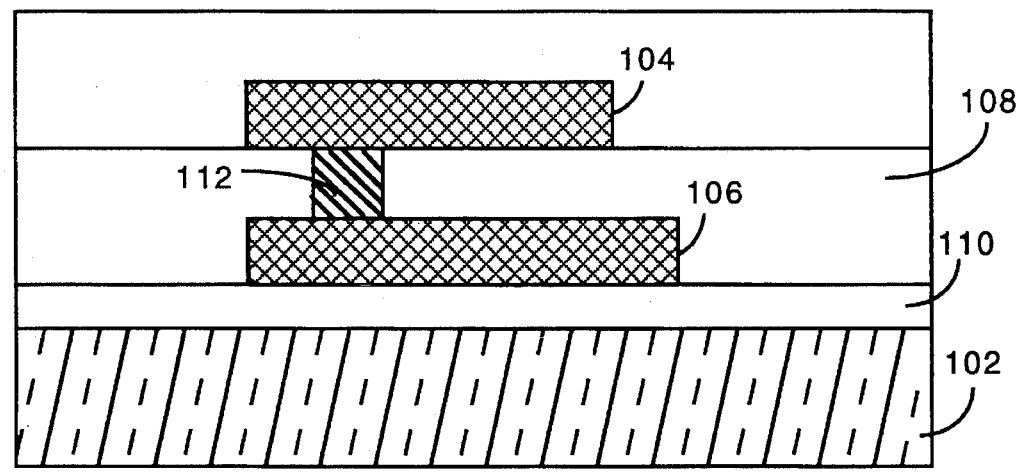
FIG. 1a is a cross-sectional illustration of a prior art interconnection structure.
Figure 1B:
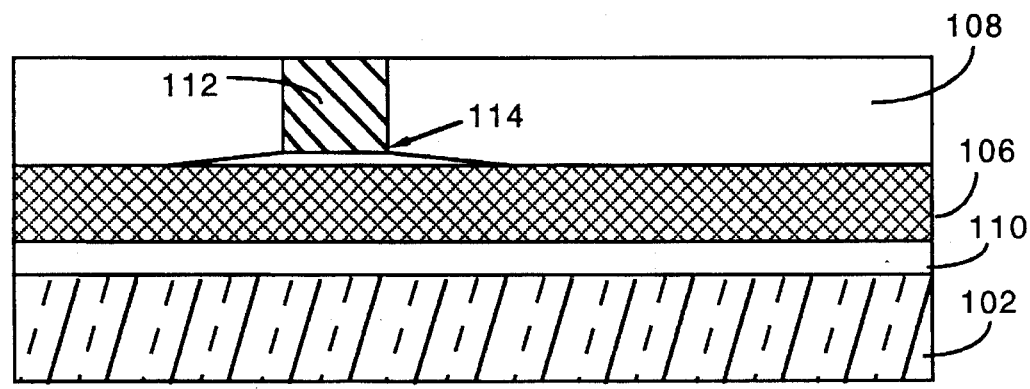
FIG. 1b is an illustration of a delaminated via in a prior art interconnection structure.
Figure 2:
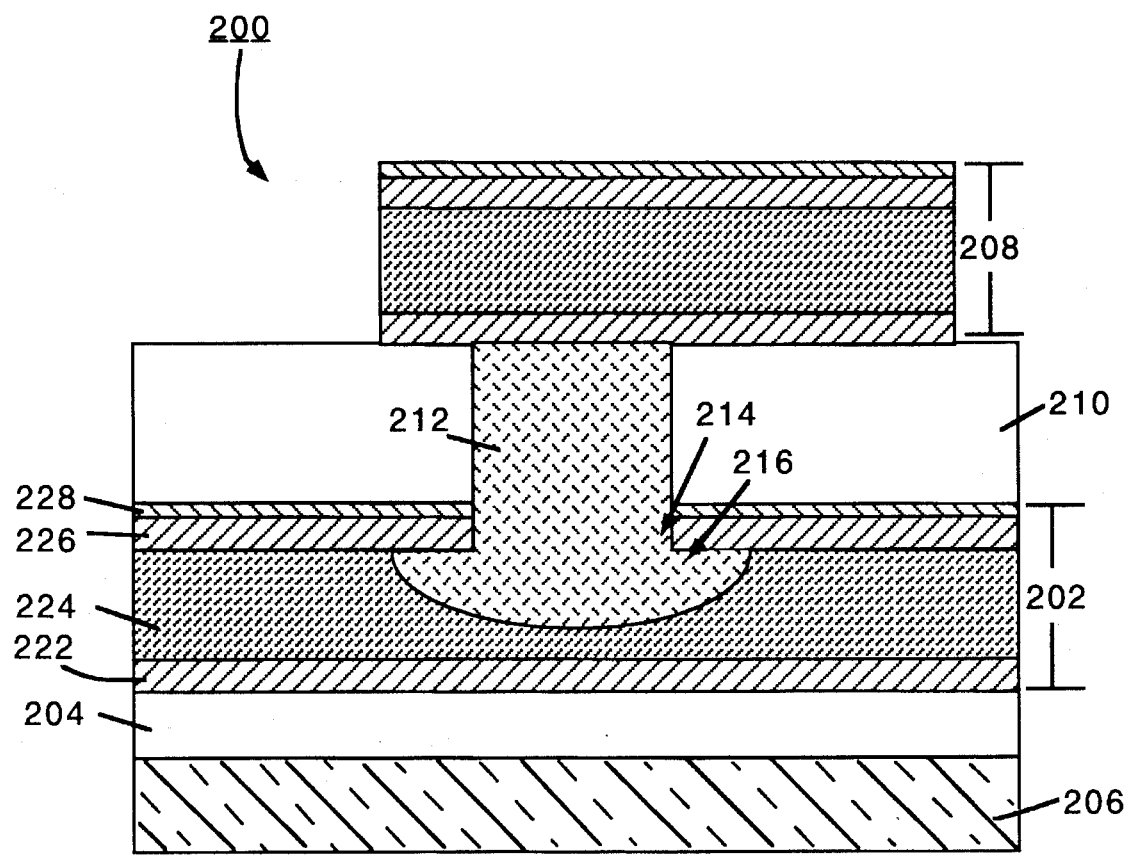
FIG. 2 is an illustration of a cross-sectional view of a preferred embodiment of a novel interconnection structure of the present invention.

A cross-sectional view of a preferred embodiment of the novel interconnection structure of the present invention is illustrated in FIG. 2. The interconnection structure 200 of the present invention includes a first multilayer interconnect formed on an insulating layer 204. Insulating layer 204 is in turn formed on or above a semiconductor substrate 206.

Semiconductor substrate 206 contains a plurality of active and passive devices such as transistors, capacitors, and resistors which are coupled together into functional circuits, such as microprocessor and memory devices, by the interconnection structure of the present invention. Multilayer interconnect 202 preferably comprises a conductive capping layer 226 preferably a refractory metal compound, a bulk conductor 224, preferably an aluminum alloy, and an electromigration shunt layer 222 preferably a refractory metal compound. Additionally, a anti-reflective coating (ARC) 228, such as TiN, may be formed on interconnection 202, if desired. A second interconnection 208, preferably a multilayer interconnection similar to interconnection 202, is separated and electrically isolated from first interconnection 202 by an insulator or interlayer dielectric (ILD) 210. Interconnection 202 is electrically coupled to interconnect 208 by via connection 212.

An important feature of the present invention is that via connection 212 is anchored into interconnection line 202. Via connection 212 has a first narrow portion 214 which extends through ILD 210, ARC 228, and capping layer 226. Via connection 212 also contains a second wider portion 216 formed in bulk conductor 224 which undercuts capping layer 226 of interconnection 202. Because the bond between capping layer 226 and bulk conductor 224 is made strong, via connection 212 is securely anchored into interconnection 202. Via connection 212 is said to undercut interconnection 202 because via connection 212 has a top portion 214 in interconnection 202 which is thinner than a lower portion 216 of via connection 212 in interconnection 202. By anchoring via connection 212 into interconnection 202, there is no need to rely upon a strong mechanical bond between via connection 212 and underlying interconnection 202 to prevent via delamination. By anchoring via connection 212 into interconnection 202, via delamination is prevented in the present invention.

According to the present invention anchor portion 216 of via connection 212 is formed entirely within and surrounded by interconnection 202 and does not simply rest on the outer surface of interconnection 202. Additionally, according to the present invention, capping layer 226 is formed thick enough to provide sufficient mechanical strength to prevent via connection 212 from pulling away or delaminating from interconnection 202 during subsequent device processing or device operation. A capping layer of between 300–1,500Å provides sufficient mechanical strength to prevent via delamination.

Additionally, according to the present invention, anchor 216 of via connection 212 undercuts capping layer 226 by an amount sufficient to lock via connection 212 securely in place. Minimal undercutting will result in poor mechanical anchoring, while too large of undercutting adversely effects via packing density. Undercutting capping layer 212 by between 500–1,500Å provides sufficient anchoring of via connection 212 while still allowing high density placement of vias across a semiconductor device.

A valuable feature in the preferred embodiment of the present invention, is the use of an aluminum alloy layer (aluminum-copper) as the bulk conductor 224 and the use of a refractory metal-aluminum layer as capping layer 226. Because aluminum alloys have low resistivities and their processing techniques well-known in the semiconductor industry, an aluminum alloy is the ideal choice for bulk conductor 224. Additionally and more importantly, by using a refractory metal/aluminum capping layer 226, capping layer 226 can be chemically reacted with and bonded to bulk conductor 224. By reacting capping layer 226 and bulk conductor 224 together, the capping layer has significantly stronger mechanical strength, than if a non-reactive capping layer was used. Because capping layer 226 has a strong mechanical bond to bulk conductor 224, a strong interface between via connection 212 and interconnection 202 is formed.

Another valuable feature of the preferred embodiment of the present invention is the use of a refractory metal capping layer 226 and a refractory metal electromigration shunt layer 222. It is to be appreciated that refractory metals are very resistant to electromigration. By providing a refractory metal conductor 226 and 222 above and below via connection 212, respectively, a continuous shunt layer is provided which prevents electromigration failures in the interconnection. It is to be appreciated that refractory metal conductors are higher in resistance than aluminum alloy layers, thus a tradeoff must be made between electromigration resistance and interconnection electrical resistance. A refractory metal electromigration shunt layer 222 of between 300–1000Å provides a good balance between electrical performance and reliability.

Additionally, according to the preferred embodiment of the present invention, anchor 216 extends to a depth beneath capping layer 226 which is sufficient to lock via connection 212 securely in place. Anchor 216, however, preferably does not extend into electromigration shunt layer 222 so that the electromigration resistance of interconnection 202 is not impeded. A via connection which extends from 1,000–3,500Å into an approximately 4,000Å bulk conductor 224 is sufficient. The exact depth at which anchor 216 extends into bulk conductor 224, however, is immaterial as long as anchor 216 extends deep enough into bulk conductor 224 to provide sufficient mechanical strength to lock via connection 212 into place.

It is to be appreciated that with the novel via profile of the present invention, via connection 212 has a very large interfacial contact area with interconnection 202. Via connection 212 has an interfacial contact with the vertical sides of capping layer 226, the underside of capping layer 226, as well as a large area contact with bulk conductor 224. The large interfacial contact area between via connection 212 and interconnection 202 improves both performance and reliability of the interconnection structure 200 of the present invention. The large interfacial contact area improves reliability by providing a large surface area for mechanical bonding between via connection 212 and interconnection 202. Additionally, the large interfacial contact area improves performance by decreasing contact resistance between via connection 212 and interconnection 202.

FIGS. 3a–3f illustrates the preferred interconnection structure of the present invention. In reference to FIG. 3a, a semiconductor substrate, including to but not limited to, silicon and gallium arsenide is provided. A plurality of devices, such as transistors and capacitors, are formed in and on substrate 302 with well-known techniques. Next an insulating layer 304 or an ILD, such as doped or undoped silicon dioxide is formed over substrate 302 with well-known techniques.

Next, a multi-interconnection line is formed on insulator 304. In the formation of multilayer interconnection, first, an approximately 200Å thick layer of titanium (Ti) 306 is formed over insulator 304 with well-known techniques, such as sputtering. Although a titanium layer is preferred, other refractory metal layers can be used. Next, an approximately 5200Å thick aluminum alloy layer 308 comprising approximately 1% copper is formed on titanium layer 306 by well-known techniques, such as sputtering. Although an aluminum alloy layer is preferred because of its low resistivity and its well-known processes, it is to be appreciated that other low resistance materials may act as the bulk conductor in interconnection line. Next, an approximately 200Å thick titanium layer 310 is formed over aluminum alloy layer 308. Although titanium is preferred, other refractory metal layers may be used, if desired. An anti-reflective coating 312, such as titanium nitride (TiN), may be formed over titanium layer 310, if desired.

Figure 3A:
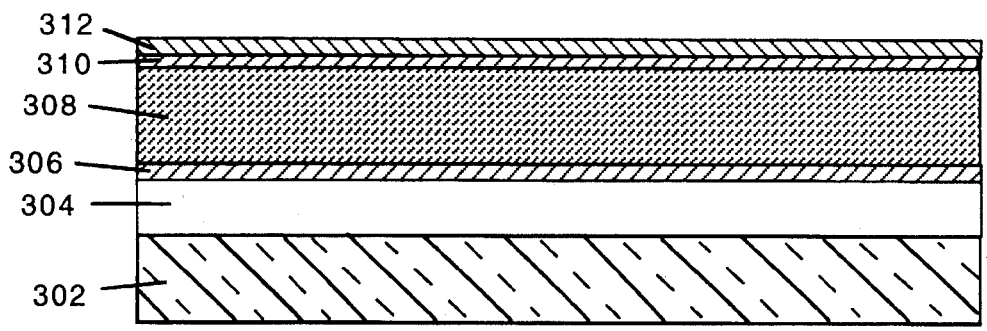
FIG. 3a is an illustration of a cross-sectional view showing a semiconductor substrate having an insulating layer formed thereon, and a plurality of metal layers formed on the insulating layer.
Figure 3B:
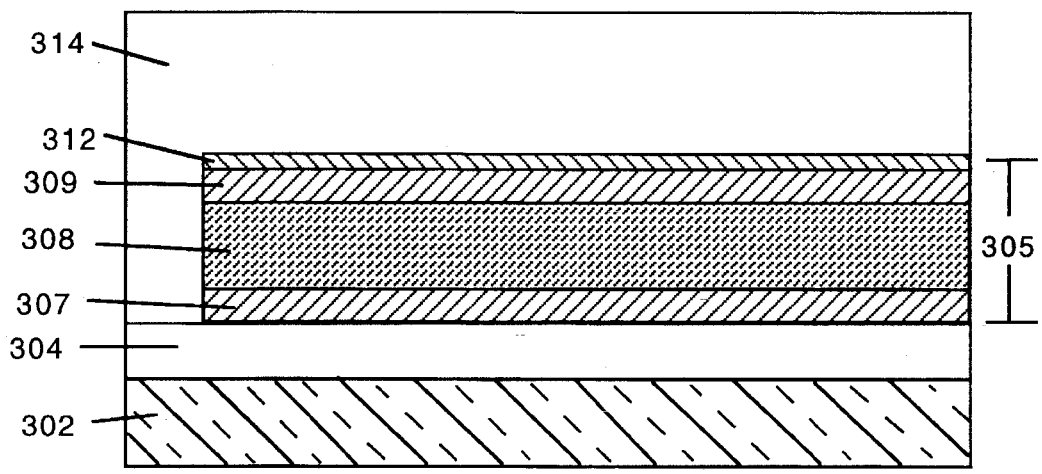
FIG. 3b is an illustration of a cross-sectional view showing the patterning of the metal layers on the substrate of FIG. 3a into an interconnection line.

Next, as shown in FIG. 3b, titanium layer 306, aluminum alloy layer 308, titanium layer 310, and titanium nitride layer 312 are patterned with wellknown photolithography and etch processes to form an interconnection line 305. TiN anti-reflective coating 312 helps to provide manufacturable photolithography process. Any well-known etching technique, such as reactive ion etching (RIE) with a chemistry comprising $BCl_3$ and $Cl_2$ can be used to pattern interconnection line 305.

Next, as shown in FIG. 3b, an interlayer dielectric (ILD) 314 such as doped silicon dioxide, is formed over and around multilayer interconnection 305. Any well-known technique can be used to form ILD 31 4, such as CVD. ILD 314 is preferably planarized at this time with well-known techniques, such as chemical-mechanical polishing or etchback, to form a planar top surface. It is to be appreciated that ILD 314 should be thick enough after planarization to provide adequate electrical isolation of interconnection 305 from a subsequent level of metallization. An approximately 10,000Å $SiO_2$ layer provides suitable isolation.

It is to be appreciated that according to the preferred embodiment of the present invention, titanium layer 310 is formed directly on aluminum alloy layer 308. When titanium and aluminum are sufficiently heated, a reaction occurs to form titanium aluminide ($TiAl_3$). According to the present invention it is preferred to cause complete reaction or substantially complete reaction of titanium layer 306 and titanium layer 310 with aluminum alloy layer 308 to form titanium aluminide layers 307 and 309, respectively, prior to via etch. This can be accomplished through the use of high temperature processes after metal formation such as during ILD deposition, ILD annealing, and high temperature ash cleans. Although the original thickness of titanium layers 306 and 310 are only approximately 200Å, a titanium aluminide layer greater than 800Å can result because the reactions consume aluminum from aluminum alloy layer 306.

It is to be noted that by forming a titanium aluminide capping layer, capping layer 309 is securely bonded to underlying aluminum alloy layer 308, providing added mechanical strength which prevents capping layer 309 and a subsequently formed anchored via connection from pealing away from aluminum alloy layer 308. An approximately 300–1500Å titanium aluminide layer has been found to provide sufficient strength to prevent via delamination. Although a titanium aluminide compound is preferred for capping layer 309, other refractory metal-aluminum compounds can be used.

It is to be appreciated that all of titanium layer 306 and 310 need not necessarily be reacted at this time. However, enough reaction of titanium layer 310 and aluminum alloy layer 308 must occur in order to provide a titanium aluminide layer thick enough to provide sufficient mechanical strength to prevent via delamination. Any unreacted Ti can be fully reacted during subsequent standard and well-known process, such as ILD formation, annealings, curings, cleanings, sputterings, and high temperature hydrogen passivation, used to complete device fabrication.

Figure 3C:
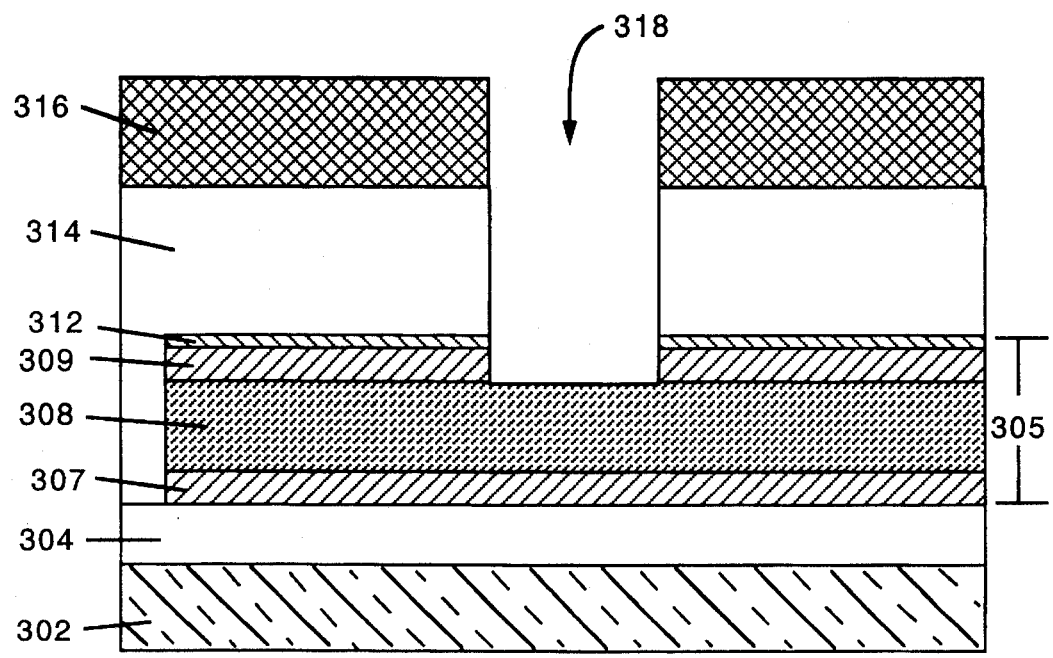
FIG. 3c is an illustration of a cross-sectional view showing the formation of a via opening on the substrate of FIG. 3b.

Next, as shown in FIG. 3c, a via hole is formed through ILD 314, titanium nitride layer 312, and titanium aluminide layer 309. First, photoresist layer 316 is formed over planarized ILD 314 and patterned with well-known photolithography techniques, to define locations where a via hole 318 is to be formed. Next, the exposed portion of ILD 314, titanium nitride 312, and titanium aluminide layer 309 are etched. Via hole 318 must be etched until aluminum alloy layer 308 is reached. A reactive ion etch (RIE) with a chemistry comprising $CF_4$ and $CHF_3$ can be used to form via hole 318.

In order to make the processes of the present invention manufacturable, it is important to precisely control the via etch depth across the substrate. It is important to insure that the via etch stops in aluminum alloy layer 308 for all vias across the substrate or wafer. This can be accomplished with several different methods. One method used in the preferred embodiment of the present invention is to chemically-mechanically polish ILD 314 to provide a very planar top surface. In this way, even with oxide deposition and polish rate variations, all vias across a substrate at a given layer are at substantially the same depth.

A second technique which can be employed is to keep titanium nitride and titanium capping layers 312 and 310, respectively, as thin as possible prior to via hole etch. Thin capping layers reduce the need for excessively long via etches to reach aluminum alloy layer 308. In order to keep the capping layers reasonably thin, it is advisable to keep processing temperature as low as possible after metal formation and before via etch, in order to prevent the formation of a thicker titanium aluminide layer. In this way via etch will not need to be excessively long to reach aluminum alloy layer 308. If this technique is used, however, sufficient reaction must occur prior to anchor hole formation so that there is a sufficient capping layer to lock a subsequently formed via into place.

Figure 3D:
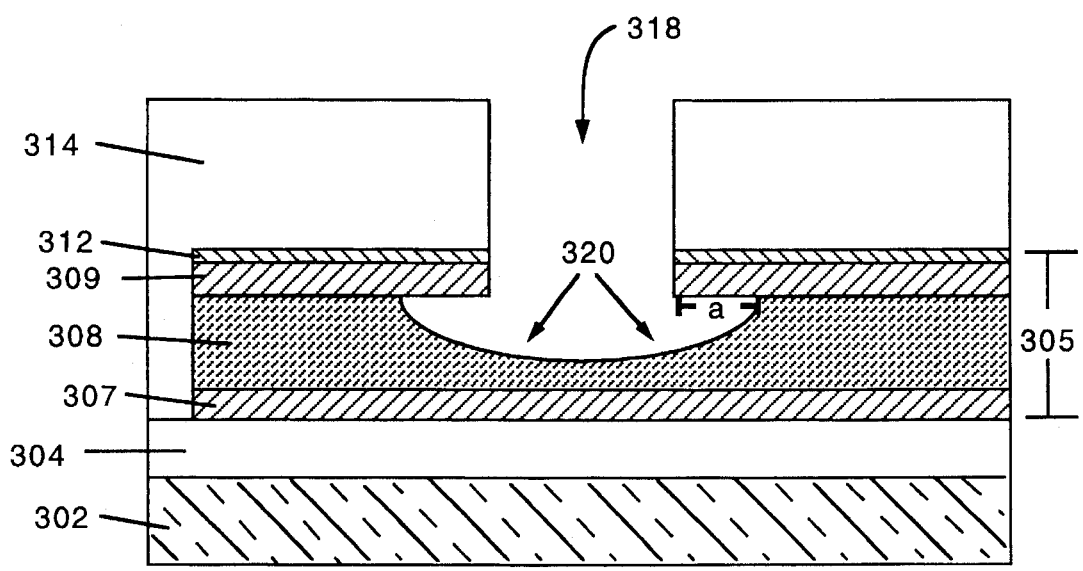
FIG. 3d is an illustration of a cross-sectional view showing the formation of an anchor opening in the interconnection line on the substrate of FIG. 3c.

Next, as shown in FIG. 3d, an anchor hole 320 is formed in interconnection 305. According to the present invention, an isotropic wet etch is used which is highly selective to conductor 308 with respect to capping layer 309 (i.e., it etches conductor 308 at a rate faster than capping layer 309). In this way, conductor 308 is laterally etched away beneath capping layer 309, forming a concave hole 320 which undercuts capping layer 309 of interconnection 305. An anchor hole 320 which undercuts capping layer 309 (i.e., extends laterally beneath capping layer 309) by an amount (a) of between 500–1500Å is preferred in the present invention.

When conductor 308 is an aluminum-copper alloy layer and capping layer 309 is a titanium aluminide layer, the following preferred process can be used to form anchor hole 320. First, after via hole 318 is etched, substrate 302 and formed metallization is dipped into a commercially available solvent known as PRS-3000 from J.T. Baker at approximately 70° C. PRS-3000 comprises approximately 40–60 wt.% of 1-methyl-2-pyrrolidinone, 30–50 wt.% sulfolane, and 5–15 wt.% menoisopropanolamine. In the preferred method, substrate 302 is dunked into two different batches of PRS-3000 for at least 7.5 minutes each in order to sufficiently clean substrate 302 of photoresist and etch polymers.

Next, substrate 302 is given a quick dip into de-ionized (DI) water at room temperature for approximately 7.0 seconds. Substrate 302 is then removed from the de-ionized water and allowed to sit for approximately one minute in an empty Quick Dump Rinse (QDR) bath. Only when both PRS-3000 and water are simultaneously present on the substrate surface does the reaction occur which etches aluminum alloy layer 308. It is to be appreciated that the PRS-3000/water combination etches titanium aluminide layer 309 significantly slower than aluminum-copper alloy layer 308. Thus, the integrity of the titanium aluminide capping layer remains strong. This insures that a subsequently formed via connection is locked into and undercuts interconnection 305, rather than simply resting on the top of interconnection 305. A valuable quality of the described etchant is that it is self-limiting. That is, after about one minute, etching essentially stops due to limited reactants. This makes the present invention very repeatable and, therefore, manufacturable. Additionally, it is to be appreciated that titanium aluminide layer 307 acts as an etch stop for the anchor hole etch insuring that anchor hole 320 does not extend all the way through interconnection 305.

After about a minute of letting substrate 302 stand with the H$_2$O/PRS-3000 solution on it's surface, the empty QDR bath fills with de-ionized water and a standard and well-known water rinse or QDR cycle is performed to clean substrate 302. Next, a standard spin-rinse-dry cycle (SRD) is used to finish the cleaning process. At this time other standard and well-known wet and dry cleaning techniques, such as ashing, can be used to sufficiently clean anchor hole 320 and the wafer surface. It is to be noted that the anchor hole etch of the present invention removes residue left from the via etch and provides a "fresh" aluminum interface. This helps to provide a strong mechanical bond between a subsequently formed via connection and interconnection 305 and helps to provide lower electrical resistance because of cleanliness.

It is to be appreciated, that although the above referenced anchor hole forming process is preferred, other techniques may be utilized. For example, dry etching techniques, such as reactive ion etching (RIE) and plasma etching can be used. Additionally, other wet etchants can be used, such as dilute solutions of buffered hydrofluoric acid or ammonia fluoride. The only requirement is that the etch technique used to form anchor hole 320 be selective to conductor 308 with respect to capping layer 309. Thus, it is quite evident that it is important to choose materials for capping layer 309 and conductor 308 which can be selectively etched.

Figure 3E:
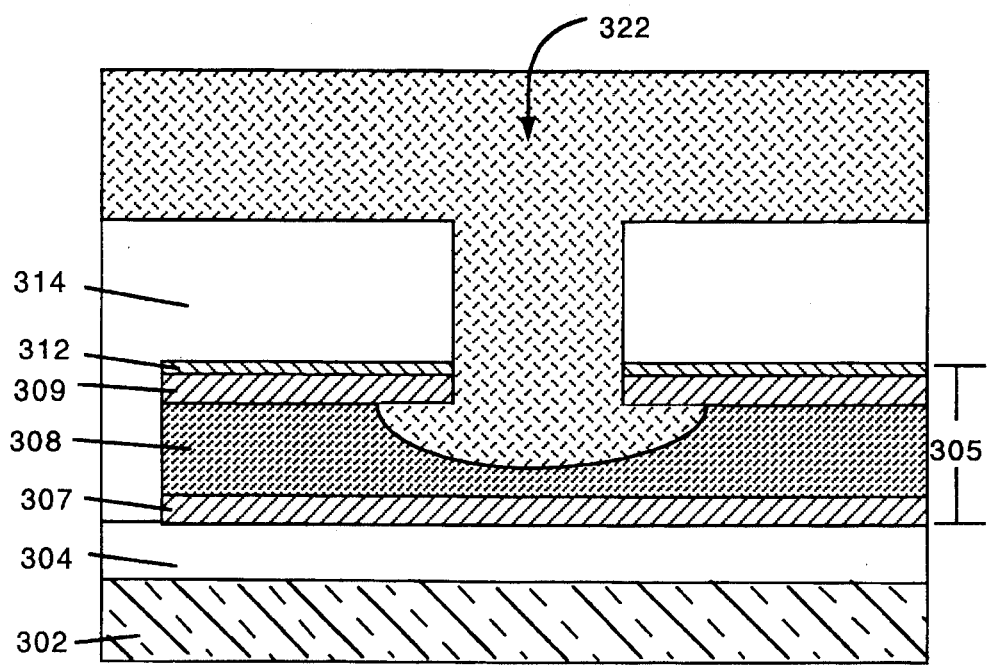
FIG. 3e is an illustration of a cross-sectional view showing the formation of a via connection in the substrate of FIG. 3d.

Next, as shown in FIG. 3e, via hole 318 and anchor hole 320 are filled with a conductive material 322, by well-known techniques, to form a via connection or plug. According to the preferred method of the present invention, a well-known sputter clean is conducted prior to metal deposition. Next, thin adhesion/barrier layers, such as Ti and TiN (not shown), are blanket deposited over ILD 314 and into via hole 318 and anchor hole 320, with well-known techniques, such as sputtering. Next, a conformal conductive material 322, preferably tungsten, is blanket deposited over the adhesion/barrier layers to fill via hole 318 and anchor hole 320. Well-known chemical vapor deposition (CVD) techniques are preferably used to form conductive material 322. A CVD tungsten layer can be formed by first forming a nucleation layer by CVD with a chemistry comprising WF$_6$ and SiH$_4$ and then forming a tungsten layer by CVD with a chemistry comprising WF$_6$ and H$_2$. CVD techniques are preferred, because CVD forms very conformal layers. In this way, conductive layer 322 forms from the side walls in, allowing for deposition of metal beneath capping layer 309. It is to be appreciated that conductive material 322 is deposited until via hole 318 and anchor hole 320 are filled.

Figure 3F:
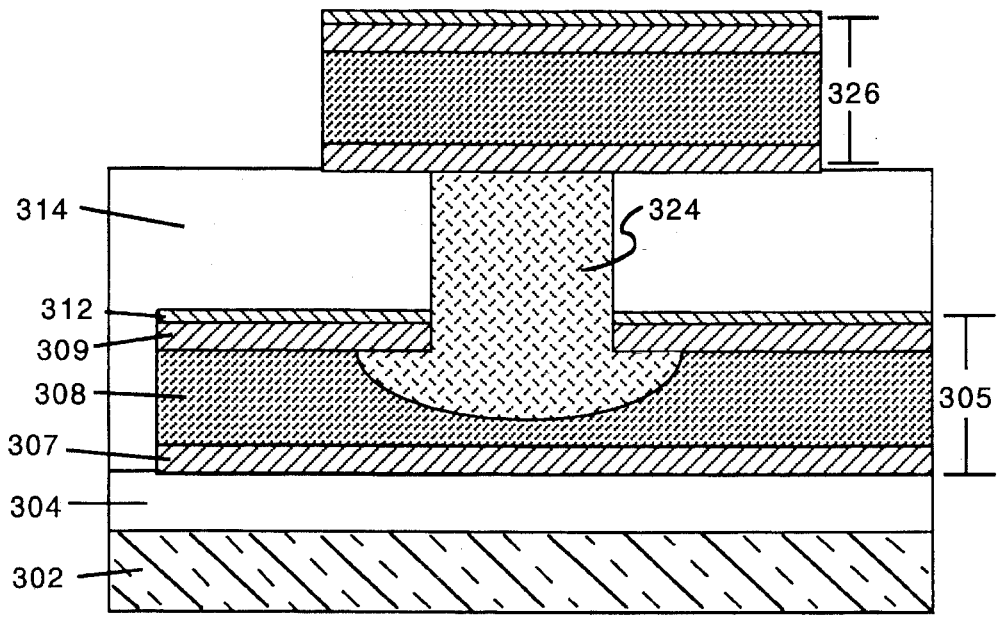
FIG. 3f is an illustration of a cross-sectional view showing the formation of a second interconnection on the substrate of FIG. 3e.

Next, as shown in FIG. 3f, tungsten layer 322 and any adhesion or barrier layers on the top surface of ILD 314 are etched back to form via connection 324. In the presently preferred embodiment of the present invention, tungsten layer 322 and any adhesion/barrier metals are etched back through the use of well-known chemical-mechanical polishing techniques. It is to be appreciated, however, that other well-known etch back techniques, such as reactive ion etching (RIE), can be utilized if desired.

Next, as shown in FIG. 3f, a second interconnection line 326 is formed over and in electrical contact with via connection 324. Second interconnection 326 makes electrical contact with first interconnection 305 through via connection 324. Second interconnection 305 is preferably formed with the same structure and methods as first interconnection 305. In this way, a subsequent level of metallization can be anchored into interconnection 326 with the novel via connection technique of the present invention. The process of forming the preferred interconnection structure of the present invention is now complete.

Thus, a novel interconnection structure which is resistant to via delamination, and its method of fabrication, have been described.

I claim:

1. A method of forming an interconnection structure of an integrated circuit formed on a semiconductor substrate comprising the steps of:

forming a first conductive layer above said substrate;

forming a second conductive layer on said first conductive layer;

forming an insulating layer over said second conductive layer;

forming a first opening through said insulating layer, and said second conductive layer; and forming a second opening in said first conductive layer beneath said first opening wherein said second opening is wider than said first opening in said second conductive layer.

2. The method of claim 1 wherein said second opening is formed by etching with an etchant which is selective to said first conductive layer with respect to said second conductive layer.

3. The method of claim 2 wherein said etchant is a wet etchant.

4. The method of claim 3 wherein said step of forming said second opening comprises the steps of:

exposing said substrate to a solution comprising approximately 40–60 weight percent of 1-methyl-2-pyrrolidinone, 30–50 weight percent sulfolane, and 5–15 weight percent menoisopropanolamine.

exposing said substrate to a solution comprising water;

after exposing said substrate to said solution comprising water, letting said substrate sit for a period of time;

rinsing said substrate; and drying said substrate.

5. The method of claim 1 wherein said first conductive layer is an aluminum alloy layer.

6. The method of claim 1 wherein said second conductive layer is a refractory metal aluminum compound layer.

7. The method of claim 6 wherein said second conductive layer is titanium aluminide.

8. The method of claim 7 wherein said first conductive layer is an aluminum alloy layer and said step of forming said second conductive layer comprises the steps of:

forming a titanium layer on said aluminum alloy layer;

and heating said aluminum alloy layer and said titanium layer until substantially all of said titanium layer reacts with said aluminum alloy layer to form said titanium aluminide layer.

9. The method of claim 1 further comprising the step of forming a titanium layer beneath said first conductive layer and above said substrate.

10. The method of claim 1 wherein said second opening extends only partially through said first conductive layer.

11. A process for forming an interconnection structure of an integrated circuit comprising the steps of:

forming an interconnection;

etching said interconnection a first time to form a first opening having a first width in said interconnection; and etching said interconnection a second time beneath said first opening such that said interconnection is etched laterally to form a second opening which extends laterally further into said interconnection than said first opening.

12. The process of claim 11 wherein said first etch forms said first opening through a conductive capping layer of said interconnection, and wherein said second etch etches laterally beneath said conductive capping layer.

13. The process of claim 12 wherein said first etch is a dry etch.

14. The process of claim 12 wherein said second etch is a wet etch.

15. The process of claim 12 wherein said conductive capping layer of said interconnection comprises titanium aluminide and wherein said interconnection comprises an aluminum alloy.

* * * * *